(12) United States Patent
Narushima et al.

(10) Patent No.: US 8,840,721 B2
(45) Date of Patent: Sep. 23, 2014

(54) METHOD OF MANUFACTURING SILICON SINGLE CRYSTAL

(75) Inventors: Yasuhito Narushima, Tokyo (JP); Fukuo Ogawa, Tokyo (JP); Toshimichi Kubota, Tokyo (JP)

(73) Assignee: Sumco Techxiv Corporation, Nagasaki (JP)

( * ) Notice: Subject to any disclaimer, the term of this patent is extended or adjusted under 35 U.S.C. 154(b) by 986 days.

(21) Appl. No.: 12/944,141

(22) Filed: Nov. 11, 2010

(65) Prior Publication Data

US 2011/0114011 A1    May 19, 2011

(30) Foreign Application Priority Data

Nov. 16, 2009  (JP) ................................. 2009-261389

(51) Int. Cl.
| | | |
|---|---|---|
| C30B 15/02 | (2006.01) | |
| C30B 15/04 | (2006.01) | |
| C30B 29/06 | (2006.01) | |
| C30B 15/20 | (2006.01) | |

(52) U.S. Cl.
CPC ................. C30B 15/04 (2013.01); C30B 29/06 (2013.01); C30B 15/20 (2013.01)
USPC ................... 117/13; 117/19; 117/21; 117/213

(58) Field of Classification Search
USPC ........................................ 117/13, 21, 19, 213
See application file for complete search history.

(56) References Cited

U.S. PATENT DOCUMENTS

| | | | | |
|---|---|---|---|---|
| 5,314,667 A | * | 5/1994 | Lim et al. ..................... | 117/213 |
| 5,580,171 A | * | 12/1996 | Lim et al. ..................... | 366/336 |
| 2003/0116083 A1 | * | 6/2003 | Kirscht et al. .................. | 117/21 |
| 2004/0083947 A1 | | 5/2004 | Weber et al. | |
| 2006/0035448 A1 | * | 2/2006 | Krautbauer et al. ........... | 438/499 |
| 2007/0056504 A1 | * | 3/2007 | Lim ................................ | 117/13 |

FOREIGN PATENT DOCUMENTS

| | | |
|---|---|---|
| EP | 0098471 A2 | 1/1984 |
| JP | H03295891 A | 12/1991 |
| JP | 10001394 A | 1/1998 |
| JP | 2008-266093 | 11/2005 |
| JP | 2005-336020 | 12/2005 |
| JP | 2008-266093 A | 11/2008 |
| WO | 9116476 A1 | 10/1991 |

OTHER PUBLICATIONS

European Search Report, Feb. 2, 2011.
Office Action in Japanese Application No. 2009-261389 dated Jul. 2, 2013 (3 pages).

* cited by examiner

*Primary Examiner* — Bob M Kunemund
(74) *Attorney, Agent, or Firm* — Thomas J. Engellenner; Reza Mollaaghababa; Pepper Hamilton LLP

(57) ABSTRACT

The present invention provides a method of producing low-resistivity silicon single crystal containing a dopant at a relatively high concentration by adding a large amount of the dopant to silicon melt when the silicon single crystal is pulled up, with suppressing occurrence of dislocation in the crystal. Specifically, the present invention provides a method of manufacturing silicon single crystal by bringing silicon seed crystal into contact with silicon melt and pulling up the silicon seed crystal while rotating the crystal to grow silicon single crystal whose straight body section has a diameter of $\phi$ mm below the silicon seed crystal, the method comprising: the dopant-adding step of adding a dopant to the silicon melt during growth of the straight body section of the silicon single crystal, while rotating the silicon single crystal at a rotational speed of $\omega$ rpm (where $\omega \geq 24-(\phi/25)$).

7 Claims, 4 Drawing Sheets

METHOD OF MANUFACTURING SILICON SINGLE CRYSTAL

BACKGROUND OF THE INVENTION

1. Field of the Invention

The present invention relates to a method of manufacturing a silicon single crystal, and in particular, to a method of manufacturing a highly-doped silicon single crystal by using a Czochralski method.

2. Description of the Related Art

Conventionally, there has been used a method of adding a dopant to a silicon melt while pulling up silicon single crystal, as one of methods of manufacturing silicon single crystal having a desired property such as desired specific resistance in the Czochralski method in which seed crystal is brought into contact with silicon melt in a crucible and the seed crystal is pulled up while being rotated to grow a silicon single crystal thereon.

As a method of adding a dopant to silicon melt while single crystal is pulled up by using the Czochralski method, there is generally known a method in which a dopant is added to silicon melt in a crucible in mid-process of pulling up silicon single crystal by using an impurity introducing device including an accommodation container for accommodating a dopant (impurity) and a vertical movement device for inserting/retracting the accommodation container into/from the crucible, so that specific resistance of the silicon single crystal is varied discontinuously in a crystallographic axis direction (refer to, for example, JP 2005-336020 Laid-Open).

Yet further, there is also known a method in which, in a case where a dopant is added to silicon melt during pulling-up of silicon single crystal, the dopant is added at a relatively low concentration until a first half portion of a straight body section of the silicon single crystal is formed and then the dopant is added at a relatively high concentration in order to prevent dislocation from occurring due to addition of the dopant in the pulled-up silicon single crystal (see, for example, JP 2008-266093 Laid-Open).

SUMMARY OF THE INVENTION

Recently, in the semiconductor field there is a demand for silicon wafers having resistivity varied according to applications. For example, there has been a demand for providing a p++ type or n++ type silicon wafer having resistivity of 0.01 Ω·cm or less by adding a dopant at a relatively high concentration thereto.

However, as a result of a keen study by the inventors, there has been revealed that, when a large amount of dopant is added by the conventional dopant adding method described above to silicon melt during pulling-up of silicon single crystal to increase the dopant concentration in the silicon single crystal, dislocation occurs in the silicon crystal which has been pulled up after addition of the dopant, whereby dislocation-free silicon single crystal cannot be obtained and the production yield decreases.

Therefore, there has been a demand for developing a method that allows manufacturing low-resistivity silicon single crystal containing a dopant at a relatively high-concentration by adding a large amount of the dopant to silicon melt while pulling up the silicon single crystal, without causing the reduction of the production yield (at the same time suppressing occurrence of dislocation).

After having carried out another keen study, the present inventors discovered that occurrence of dislocation in pulled-up crystal can be suppressed even if a large amount of dopant is added to silicon melt in mid-process of pulling up silicon single crystal, by manufacturing the silicon single crystal under a predetermined crystal rotation conditions, thereby completing the present invention.

Specifically, a method of manufacturing silicon single crystal of the present invention is a method of manufacturing silicon single crystal by bringing silicon seed crystal into contact with silicon melt and pulling up the silicon seed crystal while rotating the crystal to grow silicon single crystal whose straight body section has a diameter of $\phi$ mm below the silicon seed crystal, the method comprising: the dopant-adding step of adding a dopant to the silicon melt during growth of the straight body section of the silicon single crystal, while rotating the silicon single crystal at a rotational speed of $\omega$ rpm (where $\omega \geq 24-(\phi/25)$). By adding a dopant to silicon melt while silicon single crystal is being rotated at a rotational speed of $24-(\phi/25)$ or more as described above, it is possible to manufacture silicon single crystal containing the dopant at a relatively high concentration, with suppressing dislocation in the pulled up crystal at the same time.

The reason why dislocation in pulled-up crystal can be suppressed in such a manner as described is not known yet. It is assumed that dislocation in crystal is suppressed because a gradient of dopant concentration in silicon melt in the vicinity of a crystal growth interface of silicon single crystal is rendered gentle by adding a dopant to the melt while the silicon single crystal is being rotated at a rotational speed of $24-(\phi/25)$ or more.

Further, in the method of manufacturing silicon single crystal according to the present invention, it is preferable that the dopant is arsenic, phosphorus or antimony. This is because arsenic, phosphorus, and antimony are especially suitable as a n-type dopant. Yet further, arsenic, phosphorus or antimony are preferable because dislocation is likely to occur in pulled-up silicon single crystal when a n-type dopant, in particular, arsenic or phosphorus is added at a relatively high concentration to the melt.

Yet further, in the method of manufacturing silicon single crystal according to the present invention, it is preferable that, in the dopant-adding step, the dopant is supplied at a rate of 0.01-0.035 g/min. per 1 kg of mass of silicon melt remaining when addition of the dopant is started. Silicon single crystal having stable quality can be rapidly obtained and thus the product yield can be enhanced by obtaining a mass of the silicon melt in a crucible at the time when addition of a dopant is started and supplying the dopant at a rate of 0.01 g/min·kg-melt or more. Yet further, occurrence of dislocation in the pulled-up crystal can be reliably suppressed by supplying the dopant at a rate of 0.035 g/min·kg-melt or less.

Yet further, a method of manufacturing silicon single crystal according to the present invention is a method of manufacturing silicon single crystal by bringing silicon seed crystal into contact with silicon melt and pulling up the silicon seed crystal while rotating the crystal to grow silicon single crystal below the silicon seed crystal, the method comprising: the dopant-adding step of adding a dopant to the silicon melt during growth of a straight body section of the silicon single crystal, wherein the dopant-adding step includes increasing a rotational speed of the silicon single crystal during the dopant-adding step larger than a rotational speed of the silicon single crystal before the dopant is added to the melt. By setting the rotational speed ($\omega 2$) of the silicon single crystal during addition of the dopant larger than the rotational speed ($\omega 1$) of the silicon single crystal before adding the dopant to the melt (i.e. $\omega 1 < \omega 2$) as described above, it is possible to manufacture silicon single crystal containing a dopant at relatively high concentration, while suppressing occurrence of dislocation in the pulled-up crystal. The reason why dislocation in pulled-up crystal can be suppressed in such a manner as described is not known yet. It is assumed that dislocation in crystal is suppressed because a gradient of dopant concentration of silicon melt in the vicinity of a crystal growth interface of silicon single crystal is rendered gentle by increasing the rotational speed of the silicon single crystal so as to be $\omega 1 < \omega 2$.

In the method of manufacturing a silicon single crystal according to the present invention, it is preferable that, in a case where a diameter of the straight body section of the silicon single crystal is 150 mm, the rotational speed of the silicon single crystal before the dopant is added to the melt is 15 rpm or more and the rotational speed of the silicon single crystal during the dopant-adding step is 18 rpm or more. Further, it is preferable that, in a case where a diameter of the straight body section of the silicon single crystal is 200 mm, the rotational speed of the silicon single crystal before the dopant is added to the melt is 13 rpm or more and, the rotational speed of the silicon single crystal during the dopant-adding step is 16 rpm or more. Yet further, it is preferable that, in a case where a diameter of the straight body section of the silicon single crystal is 300 mm, the rotational speed of the silicon single crystal before the dopant is added to the melt is 9 rpm or more and the rotational speed of the silicon single crystal during the dopant-adding step is 12 rpm or more. Occurrence of dislocation in pulled-up crystal can be efficiently suppressed by setting the rotational speed of the silicon single crystal at the time of pulling up the crystal at an appropriate speed in accordance with the diameter of the straight body section of the silicon single crystal.

According to the present invention, low-resistivity silicon single crystal containing a dopant at a relatively high-concentration can be manufactured by adding a large amount of the dopant to silicon melt when the silicon single crystal is being pulled up, without decreasing the production yield (but at the same time suppressing dislocation in the obtained crystal).

DETAILED DESCRIPTION OF THE INVENTION

Figure 1:
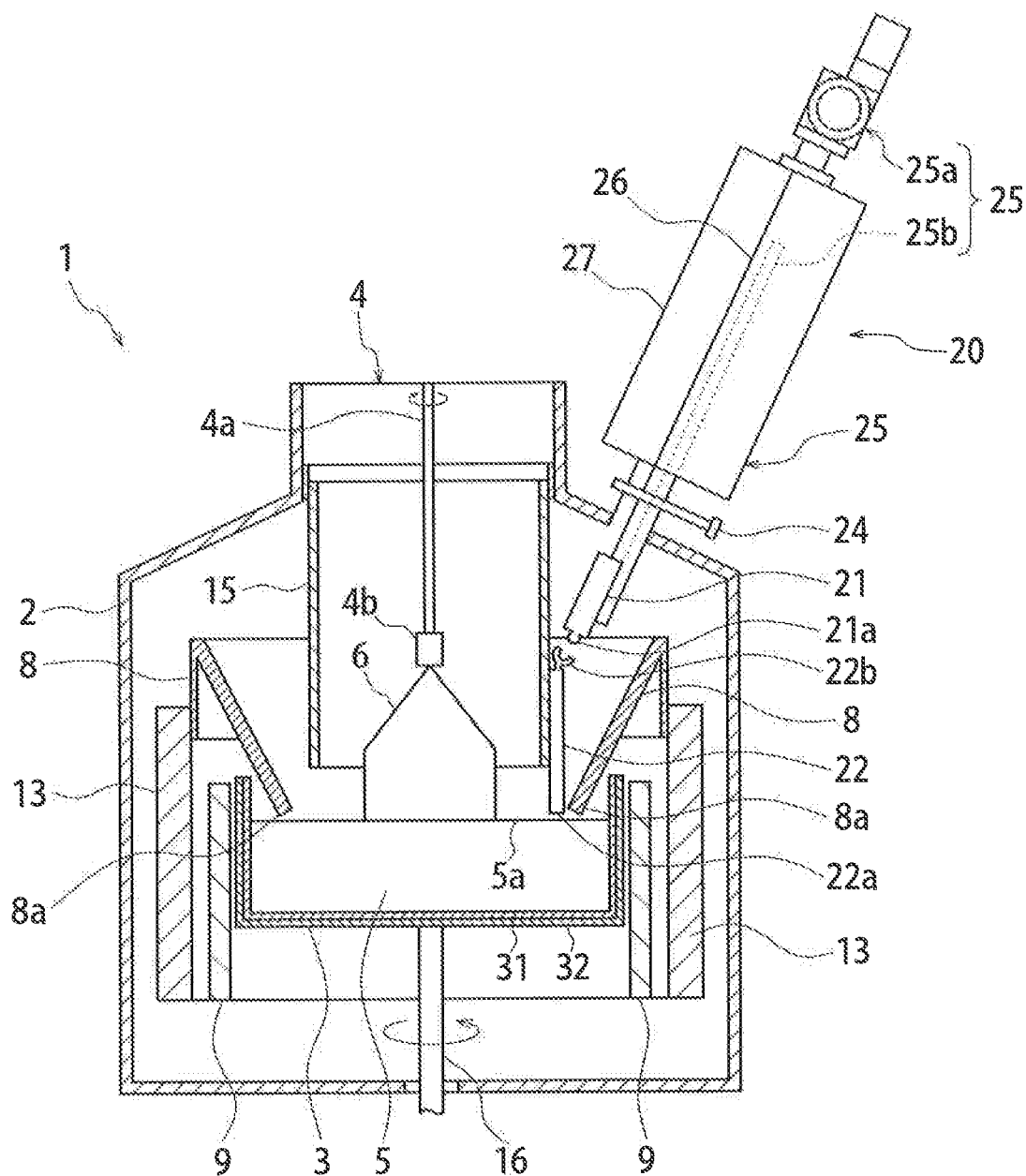
FIG. 1 is an explanatory view of a typical silicon single crystal manufacturing device for use in a method of manufacturing silicon single crystal according to the present invention.
Figure 3:
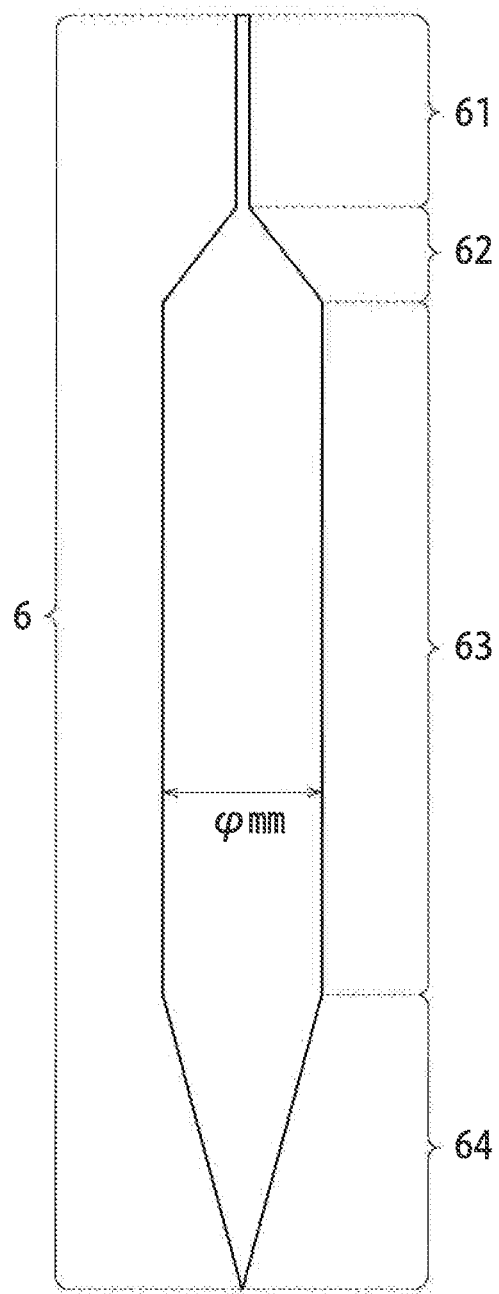
FIG. 3 is a front view showing an example of a silicon single crystal manufactured by the method of manufacturing silicon single crystal according to the present invention.

Hereinafter, an embodiment of the present invention will be described in detail with reference to the drawings. In one example of a method of manufacturing silicon single crystal according to the present invention, silicon single crystal 6 having a straight body section with a diameter of $\omega$ mm as shown in FIG. 3 is manufactured by using a silicon single crystal manufacturing device 1 as shown in FIG. 1.

The silicon single crystal manufacturing device 1 includes a chamber (pulling up furnace) 2, and a dopant supplying mechanism 20, a part of which is located in the chamber 2. The silicon single crystal 6 is manufactured within the chamber 2 of the silicon single crystal manufacturing device 1 by using the Czochralski method.

There are provided within the chamber 2: a crucible 3 for charging polycrystalline silicon as a raw material of the silicon single crystal 6; a heater 9 provided around the crucible 3 for heating and melting the raw material in the crucible 3 to obtain silicon melt 5; and a heat insulation tube 13 disposed between the heater 9 and an inner wall of the chamber 2. Further, above the crucible 3, there are provided a crystal rotation and pulling up mechanism 4, a flow-straightening tube 15 made of quartz, and a heat shielding plate 8. Yet further, a rotation axis 16 for rotating the crucible 3 is provided below the crucible 3. Note that the crucible 3 is formed by a graphite crucible 32 and a quartz crucible 31 provided inside of the graphite crucible 32.

The crystal rotation and pulling up mechanism 4 has a wire rope 4a, the tip end of which is provided with a seed-crystal holding unit (seed chuck) 4b for holding silicon seed crystal (not shown) for growing the silicon single crystal 6 thereon. The crystal rotation and pulling up mechanism 4 pulls up the seed-crystal holding unit 4b, the silicon seed crystal and the silicon single crystal 6 with rotating them by taking the wire rope 4a up while rotating the wire rope 4a.

The heat shielding plate 8 is provided to shield the silicon seed crystal and the silicon single crystal 6 grown below the silicon seed crystal from radiant heat emitted from the high-temperature sections such as the crucible 3, the melt 5 and the heater 9. The flow-straightening tube 15 is provided to cause purge gas (gas supplied to and discharged from the inside of the chamber 2 in order to remove impurities in the chamber 2) to flow in the vertical direction of the chamber 2. The distance between the lower end 8a of the heat shielding plate 8 and a surface 5a of the melt 5 may be adjusted by moving the crucible 3 upward/downward or moving the heat shielding plate 8 upward/downward by using an elevation device (not shown).

The rotation axis 16 provided below the crucible 3 rotates the crucible 3 in the same rotation direction as that of the silicon single crystal 6 or in a direction reverse to that of the silicon single crystal 6 as shown in FIG. 1. The rotation axis 16 may be configured so as to be movable upward/downward in a vertical direction, depending on applications, so that the crucible 3 can be moved in the vertical direction.

Figure 2:
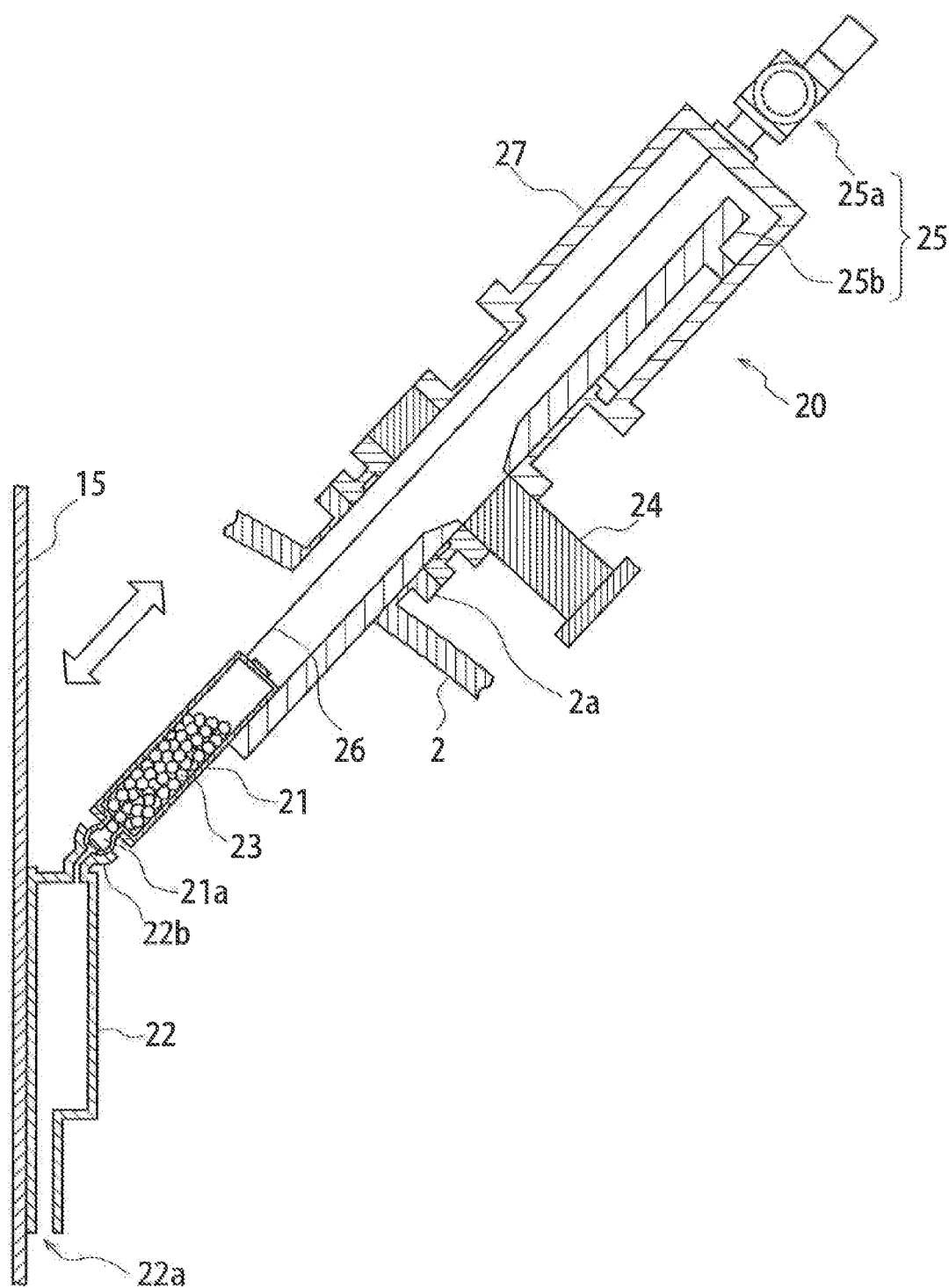
FIG. 2 is a schematic sectional view showing in an enlarged manner a main portion including a dopant supplying mechanism of the silicon single crystal manufacturing device of FIG. 1.

As shown in FIG. 1 and FIG. 2, the dopant supplying mechanism 20 is formed primarily by a dope tube (sample tube) 21, a supplying tube 22 and a sample chamber 27 and is used during growth of the silicon single crystal 6, more specifically, when a dopant is added to the melt 5 during growth of the straight body section 63.

In the present embodiment, the dope tube 21 is made of quartz, has a substantially cylindrical shape, and moves up/down between the sample chamber 27 and the supplying tube 22 by an elevating means 25. More specifically, the dope tube 21 is disposed movable along a groove of a guide rail 25b provided to extend from the inside of the sample chamber 27 to the inside of the chamber 2, and is guided by the guide rail 25b to move up/down between the inside of the sample chamber 27 and the inside of the chamber 2. The vertical movement of the dope tube 21 can be effected by driving a wire 26 attached to the dope tube 21 by a wire driving device 25a.

The supplying tube 22 is provided on the outside of the flow-straightening tube 15. An open end 22a of the supplying tube 22 is located in the vicinity of the surface 5a of the melt 5 and other end 22b thereof is shaped in a form capable of being engaged and connected with the tip end 21a of the dope tube 21 at the time of adding a dopant to the melt 5.

The sample chamber 27 accommodates a dopant raw material 23 to be added to the melt 5 through the dope tube 21. The sample chamber 27 is externally attached to a flange section 2a of the chamber 2 through a shielding means 24 which will be described later. In the present embodiment, it is preferable that the dopant raw material 23 accommodated in the sample chamber 27 is in granular or powdery form. Examples of the dopant include a n-type dopant such as arsenic (As), phosphorus (P), antimony (Sb) and a p-type dopant such as boron (B).

The shielding means 24 is provided between the chamber 2 and the sample chamber 27 in order to thermally shield the sample chamber 27 from the chamber 2. Provision of the shielding means 24 thermally shields the sample chamber 27 from radiant heat emitted from the inside of the chamber 2, whereby the dopant can be sublimated (gasified) and added to the melt 5 at a desired timing.

The silicon single crystal manufacturing device 1 described above can manufacture, e.g. by the method described below, silicon single crystal 6 in which a dopant has been added at a relatively high concentration such that resistivity of the crystal measured by a four-point probe resistivity measurement unit is 0.01 Ω·cm or lower.

First, silicon polycrystalline as a raw material is charged in the crucible 3, heated by the heater 9, and melted to obtain the melt 5. Then, after the melt 5 has reached a stable melting state, the wire rope 4a is lowered to bring the silicon seed crystal (not shown) held by the seed-crystal holding unit 4b into contact with the melt 5. A dopant for adjusting electric resistivity may optionally be added to the melt 5 in advance. In a case where a dopant is added to the melt in advance, the dopant may be added such that, when silicon single crystal is directly pulled up from the melt 5 without supplying any dopant thereto from the dopant supplying mechanism 20, resistivity of the pulled-up silicon single crystal (measured by the four-point probe resistivity measurement unit) is more than 0.01 Ω·cm.

After the silicon seed crystal has been sufficiently immersed in the melt 5, the wire rope 4a is raised such that the silicon seed crystal is pulled up from the melt 5 to grow silicon single crystal (silicon ingot) 6 below the silicon seed crystal. When the silicon single crystal 6 is pulled up by the crystal rotation and pulling up mechanism 4, the crucible 3 is rotated by the rotation axis 16, while the wire rope 4a (silicon single crystal 6) is rotated in the same direction as the rotation direction of the rotation axis 16 or in a reversed direction to that of the rotation axis 16. During pulling-up of the silicon single crystal 6, impurities and/or evaporants generated in the chamber 2 can be discharged to the outside of the chamber 2 by passing an inert gas such as argon gas through the chamber 2 which has been sealed from the air outside and degassed to the vacuum state (for example, about several kPa).

In the present embodiment, the silicon single crystal 6 is grown according to the pulling-up procedure described above from the silicon seed crystal in the following order of sections: a neck section 61 of which diameter has been reduced to a relatively small diameter; a shoulder section 62 of which diameter gradually increases; a straight body section 63 having a constant diameter ($\phi$ mm=$\phi$/25 inches); and a tail section 64 of which diameter gradually decreases. In the silicon single crystal manufacturing device 1, the silicon single crystal 6 containing a dopant at a relatively high concentration is manufactured by adding the dopant to the melt 5 by using the dopant supplying mechanism 20 during growth of the straight body section 63.

In general, the degree of solidification point depression of the melt 5 increases when a large amount of dopant is added to the melt 5 to obtain silicon single crystal 6 having a relatively low resistivity (for example, the resistivity or specific resistance of 0.01 Ω·cm or less measured by the four-point probe resistivity measurement unit), whereby, in such a case as this, growth which is different from at a normal silicon growth surface starts at a crystal growth interface due to the compositional supercooling phenomenon and single-crystallization of silicon is inhibited. However, the degree of inhibition against single-crystallization of silicon is relatively small during the growth of the straight body section 63, as compared with the growths of other sections of the silicon single crystal. Therefore, it is preferable to add a dopant during growth of the straight body section 63. It is further preferable that the addition of the dopant is carried out during a period in the growth of the straight body section 63 during which period dislocation is less likely to occur. This particular period is specified in advance by experiments in view of other doping periods (or magnitude of crystal growth) in the growth of the straight body section 63 during which other periods dislocation is likely to occur. The other periods are also experimentally determined in advance for each growth condition.

The target diameter $\phi$ of the straight body section 63 may be determined in advance according to a desired silicon single crystal quality, prior to the start of pulling-up of silicon seed crystal. Further, the diameter $\phi$ of the straight body section 63 can be controlled by continuously measuring the diameter $\phi$ of the straight body section 63 during the pulling-up process by, e.g. an optical method such as image processing using a camera or a weight-weighing method such as crystal weight measurement using a load cell, and adjusting the crucible-lowering speed, the temperature of the heater, the pulling-up speed of the silicon single crystal, and the like, on the basis of the measured diameter.

Further, in the silicon single crystal manufacturing device 1, the dopant is added to the melt 5 during growth of the straight body section 63 while the silicon single crystal 6 is rotated, for example, at a rotational speed $\omega$ rpm (where, $\omega \geq 24-(\phi/25)$), in order to suppress dislocation from occurring in the crystal pulled up after addition of the dopant. In the present embodiment, the rotational speed of the silicon single crystal 6 may be any value, provided that the rotational speed is more than or equal to $24-(\phi/25)$ and falls within a range where the manufactured silicon single crystal 6 is prevented from being significantly deformed (i.e. losing circularity) due to centrifugal force at the time of rotation. The rotational speed of the silicon single crystal 6 can be assumed to be equal to a rotational speed of the wire rope 4a.

Specifically, the dopant is added by releasing the shielding means 24 and lowering the dope tube 21 to connect the dope tube 21 with the supplying tube 22 in a state where the growing silicon single crystal 6 is being rotated at the rotational speed $\omega$ rpm. More specifically, the dope tube 21 is connected with the supplying tube 22 such that the inside of the dope tube 21 communicates with the open end 22a of the supplying tube 22; the dopant raw material 23 existing in the dope tube 21 is heated and sublimated by the radiant heat from the melt 5 and the like; and the dopant in a gaseous state is sprayed onto the surface 5a of the melt 5 and is introduced into the melt 5, so that the dopant is added to the melt 5.

Although the dopant may be added at any rate, it is preferable that the dopant is added at a rate of 0.01-0.035 g/min. per 1 kilogram of the melt remaining in the crucible 3 when the doping is started. In general, the concentration distribution of a dopant in the melt 5 to which the dopant has been added does not immediately reach a uniform state and the quality of the silicon single crystal 6 remains unstable for a while after the addition of the dopant. However, the silicon single crystal 6 having a stable quality can be quickly obtained and the production yield thereof can be enhanced by setting the rate of adding the dopant at 0.01 g/min·kg-melt or more as described above. Further, dislocation in the pulled-up crystal can be more reliably suppressed by setting the rate of adding the dopant at 0.035 g/min·kg-melt or less. The mass of the melt in the crucible 3 existing when addition of the dopant is started can be measured by using a conventional manner such as first measuring the weight of the grown crystal using the aforementioned optical or weight-weighing method and then subtracting the weight of the grown crystal from the amount of the raw material filled in the crucible. The rate of adding a dopant can be adjusted, for example, by carrying out a preliminary manufacturing experiment to determine arrangement conditions, operation conditions and the like of each constituting element in the chamber 2.

According to one example of the method of manufacturing silicon single crystal using the silicon single crystal manufacturing device 1 described above, low-resistivity silicon single crystal containing a dopant at a relatively high concentration can be manufactured by adding a large amount of dopant to the melt while the crystal is pulled up, without decreasing the production yield thereof (but at the same time suppressing dislocation in the crystal).

In one example of the manufacturing method of silicon single crystal described above, the rotational speed of the silicon single crystal 6 may be changed to any value within the bounds of technological common sense possessed by one skilled in the art, except when the dopant is added (i.e. the rotational speed may be changed by an operator before or after addition of the dopant). The rotational speed of the silicon single crystal 6 during the periods other than addition of the dopant (i.e. the periods before/after addition of the dopant) is preferably slower than the rotational speed of the silicon single crystal 6 during the period of adding the dopant, in terms of suppressing deformation of the silicon single crystal 6 due to rotation. The rotational speed of the crucible may be changed to any value within the bounds of technological common sense possessed by one skilled in the art.

In another example of the method of manufacturing silicon single crystal according to the present invention using the silicon single crystal manufacturing device 1 described above, occurrence of dislocation in the pulled-up crystal is suppressed by setting the rotational speed of the silicon single crystal 6 when the dopant is added to the melt 5 during growth of the straight body section 6 larger than the rotational speed of the silicon single crystal 6 prior to the addition of the dopant to the melt 5.

Specifically, for example, in a case where silicon single crystal 6 whose straight body section 63 has a diameter of 150 mm is manufactured, occurrence of dislocation in the pulled-up crystal can be suppressed by setting the rotational speed of the silicon single crystal 6 before addition of the dopant to the melt 5 at 15 rpm or more and the rotational speed of the silicon single crystal 6 during doping at 18 rpm or more. Further, in a case where the silicon single crystal 6 whose straight body section 63 has a diameter of 200 mm is manufactured, occurrence of dislocation in the pulled-up crystal can be suppressed by setting the rotational speed of the silicon single crystal 6 before addition of the dopant to the melt 5 at 13 rpm or more and the rotational speed of the silicon single crystal 6 during doping at 16 rpm or more. Yet further, in a case where the silicon single crystal 6 whose straight body section 63 has a diameter of 300 mm is manufactured, occurrence of dislocation in the pulled-up crystal can be suppressed by setting the rotational speed of the silicon single crystal 6 before addition of the dopant to the melt 5 at 9 rpm or more and the rotational speed of the silicon single crystal 6 during doping at 12 rpm or more. The rotational speed of the crucible during the pulling-up process of the silicon single crystal may be changed to any value within the bounds of technological common sense possessed by one skilled in the art.

EXAMPLES

The present invention will be described in further detail by Examples below. It should be noted that the present invention is not limited to these Examples.

Examples 1-3

Growing silicon single crystal using non-doped silicon melt was initiated at a silicon single crystal rotational speed of 15 rpm by using the silicon single crystal manufacturing device 1 as shown in FIG. 1. Arsenic (As) as a dopant was added such that each of silicon single crystals would have resistivity of 0.01 Ω·cm, in a state where the rotational speed of each silicon single crystal had been increased during the period of growing the straight body sections thereof, whereby silicon single crystals each having a diameter of 150 mm were grown. Specifically, these silicon single crystals were grown by setting the rotational speed thereof during addition of the dopant at 18 rpm (Example 1), 19 rpm (Example 2), and 20 rpm (Example 3), respectively. The dopant was added at a rate of 0.035 g/min·kg-melt. Further, the rotational speed of the crucible during growth of the silicon single crystals was kept constant at 7 rpm.

Figure 4:
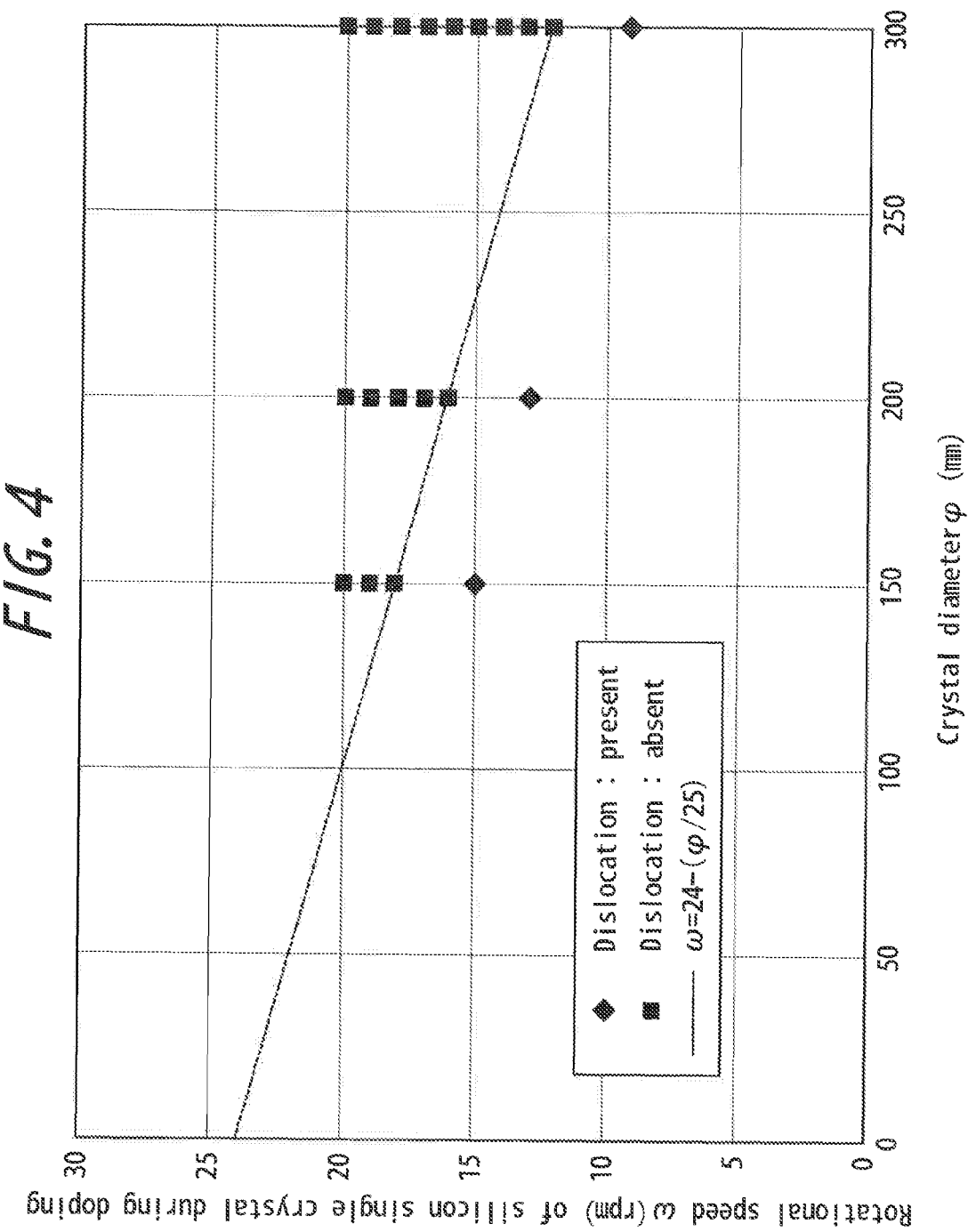
FIG. 4 is a graph showing a relationship between diameter of straight body section of silicon single crystal and rotational speed of the silicon single crystal during doping at which dislocation in pulled-up crystal is suppressed.

Then, visual inspection was made as to whether or not dislocation had occurred in each of the silicon single crystals thus manufactured. Specifically, crystal habit lines appearing at a surface of each silicon single crystal were observed and it was determined that dislocation had occurred in a case where the crystal habit lines disappeared midway and that no dislocation had occurred in a case where the crystal habit lines were continuously present. The results are shown in FIG. 4.

Comparative Example 1

Silicon single crystal having a diameter of 150 mm was grown in the same manner as those of Examples 1-3, except that rotational speed of the silicon single crystal was not changed during addition of arsenic (As) as the dopant (i.e. the rotational speed remained at 15 rpm).

Then, whether dislocation had occurred or not in the silicon single crystal thus manufactured was checked in a manner similar to those of Examples 1-3. The result is shown in FIG. 4.

Examples 4-8

Growing silicon single crystal using non-doped silicon melt was initiated at a silicon single crystal rotational speed of 13 rpm by using the silicon single crystal manufacturing device 1 as shown in FIG. 1. Arsenic (As) as a dopant was added such that each of silicon single crystals would have resistivity of 0.01 Ω·cm, in a state where the rotational speed of each silicon single crystal had been increased during the period of growing the straight body sections thereof, whereby silicon single crystals each having a diameter of 200 mm were grown. Specifically, these silicon single crystals were grown by setting the rotational speed thereof during addition of the dopant at 16 rpm (Example 4), 17 rpm (Example 5), 18 rpm (Example 6), 19 rpm (Example 7), and 20 rpm (Example 8) respectively. The dopant was added at a rate of 0.035 g/min·kg-melt. Further, the rotational speed of the crucible during growth of the silicon single crystals was kept constant at 7 rpm.

Then, whether dislocation had occurred or not in the silicon single crystal thus manufactured was checked in a manner similar to those of Examples 1-3. The results are shown in FIG. 4.

Comparative Example 2

Silicon single crystal having a diameter of 200 mm was grown in the same manner as those of Examples 4-8, except that rotational speed of the silicon single crystal was not changed during addition of arsenic (As) as the dopant (i.e. the rotational speed remained at 13 rpm).

Then, whether dislocation had occurred or not in the silicon single crystal thus manufactured was checked in a manner similar to those of Examples 1-3. The result is shown in FIG. 4.

Examples 9-17

Growing silicon single crystal using non-doped silicon melt was initiated at a silicon single crystal rotational speed of 9 rpm by using the silicon single crystal manufacturing device 1 as shown in FIG. 1. Arsenic (As) as a dopant was added such that each of silicon single crystals would have resistivity of 0.01 Ω·cm, in a state where the rotational speed of each silicon single crystal had been increased during the period of growing the straight body sections thereof, whereby silicon single crystals each having a diameter of 300 mm were grown. Specifically, these silicon single crystals were grown by setting the rotational speed thereof during addition of the dopant at 12 rpm (Example 9), 13 rpm (Example 10), 14 rpm (Example 11), 15 rpm (Example 12), 16 rpm (Example 13), 17 rpm (Example 14), 18 rpm (Example 15), 19 rpm (Example 16), and 20 rpm (Example 17), respectively. The dopant was added at a rate of 0.035 g/min·kg-melt. Further, the rotational speed of the crucible during growth of the silicon single crystals was kept constant at 7 rpm.

Comparative Example 3

Silicon single crystal having a diameter of 300 mm was grown in the same manner as those of Examples 9-17, except that rotational speed of the silicon single crystal was not changed during addition of arsenic (As) as the dopant (i.e. the rotational speed remained at 9 rpm).

Then, whether dislocation had occurred or not in the silicon single crystal thus manufactured was checked in a manner similar to those of Examples 1-3. The result is shown in FIG. 4.

As can be clearly understood from FIG. 4, occurrence of dislocation in the manufactured silicon single crystals can be suppressed by setting the rotational speed ω of the silicon single crystal during addition of the dopant at 24−(φ/25) or more. Further, occurrence of dislocation in the manufactured silicon single crystal can be suppressed by increasing the crystal rotational speed of the silicon single crystal when the dopant is added.

Other experiments (of manufacturing silicon single crystal) carried out in the same manner as described above, except that arsenic (As) as the dopant was replaced with phosphorus (P), exhibited similar results.

[Industrial Applicability]

According to the present invention, low-resistivity silicon single crystal containing a dopant at a relatively high concentration can be manufactured by adding a large amount of the dopant to molten silicon when the silicon single crystal is pulled up, without decreasing the production yield (but at the same time suppressing occurrence of dislocation in the crystal).

What is claimed is:

1. A method of manufacturing silicon single crystal by bringing silicon seed crystal into contact with silicon melt and pulling up the silicon seed crystal while rotating the crystal to grow silicon single crystal whose straight body section has a diameter of φ mm below the silicon seed crystal, the method comprising:
a dopant-adding step of adding a dopant to the silicon melt during growth of the straight body section of the silicon single crystal, while rotating the silicon single crystal at a rotational speed of ω rpm (where ω≥24−(φ/25)), wherein
the rotational speed of the silicon single crystal before the dopant-adding step is slower than the rotational speed of the silicon single crystal during the dopant-adding step.

2. The method of manufacturing silicon single crystal of claim 1, wherein the dopant is arsenic, phosphorus or antimony.

3. The method of manufacturing silicon single crystal of claim 1 or 2, wherein the dopant-adding step comprises supplying the dopant at a rate of 0.01-0.035 g/min. per 1 kg of mass of silicon melt remaining when addition of the dopant is started.

4. A method of manufacturing silicon single crystal by bringing silicon seed crystal into contact with silicon melt and pulling up the silicon seed crystal while rotating the crystal to grow silicon single crystal below the silicon seed crystal, the method comprising:
a dopant-adding step of adding a dopant to the silicon melt during growth of a straight body section of the silicon single crystal,
wherein the dopant-adding step includes increasing a rotational speed of the silicon single crystal during the dopant-adding step larger than a rotational speed of the silicon single crystal before the dopant is added to the melt.

5. The method of manufacturing silicon single crystal of claim 4, wherein a diameter of the straight body section of the silicon single crystal is 150 mm, the rotational speed of the silicon single crystal before the dopant is added to the melt is 15 rpm or more, and the rotational speed of the silicon single crystal during the dopant-adding step is 18 rpm or more.

6. The method of manufacturing silicon single crystal of claim 4, wherein a diameter of the straight body section of the silicon single crystal is 200 mm, the rotational speed of the silicon single crystal before the dopant is added to the melt is 13 rpm or more and, the rotational speed of the silicon single crystal during the dopant-adding step is 16 rpm or more.

7. The method of manufacturing silicon single crystal of claim 4, wherein a diameter of the straight body section of the silicon single crystal is 300 mm, the rotational speed of the silicon single crystal before the dopant is added to the melt is 9 rpm or more and the rotational speed of the silicon single crystal during the dopant-adding step is 12 rpm or more.

* * * * *